United States Patent [19]

Matsushita et al.

[11] Patent Number: 5,341,402
[45] Date of Patent: Aug. 23, 1994

[54] AUTOMATIC FREQUENCY CONTROL METHOD AND DEVICE FOR USE IN RECEIVER

[75] Inventors: Naohiro Matsushita, Mishima; Masaaki Makino, Shizuoka, both of Japan

[73] Assignee: Tokyo Electric Co., Ltd., Tokyo, Japan

[21] Appl. No.: 835,210

[22] Filed: Feb. 13, 1992

[30] Foreign Application Priority Data

Feb. 19, 1991 [JP] Japan .................................. 3-045379
Jun. 3, 1991 [JP] Japan .................................. 3-131393

[51] Int. Cl.$^5$ ........................................... H04L 27/06
[52] U.S. Cl. .................................. 375/97; 375/81; 455/164.2; 455/182.2; 455/192.2
[58] Field of Search .......... 375/90, 97, 81, 119, 375/120; 455/164.2, 183.2, 182.2, 192.2; 329/302, 307, 308

[56] References Cited

U.S. PATENT DOCUMENTS

| | | | |
|---|---|---|---|
| 4,498,191 | 2/1985 | Rogers | 455/164 |
| 4,660,215 | 4/1987 | Horiike et al. | 375/97 |
| 4,715,001 | 12/1987 | Deem et al. | 455/164.2 |
| 4,835,790 | 5/1989 | Yoshida et al. | 375/97 |
| 4,879,728 | 11/1989 | Tarallo | 375/97 |
| 4,959,872 | 9/1990 | Imai et al. | 455/182.2 |
| 5,014,348 | 5/1991 | Boone et al. | 455/183.2 |
| 5,101,509 | 3/1992 | Lai | 455/183.2 |
| 5,107,522 | 4/1992 | Kitayama et al. | 375/97 |
| 5,151,925 | 9/1992 | Gelin et al. | 375/82 |

FOREIGN PATENT DOCUMENTS 0349064  1/1990  France .
61-281655  12/1986  Japan .

OTHER PUBLICATIONS

"NHK Radio FM Technical Textbook"; Nippon Hoso Kyokai, Aug. 1, 1983, Japan, pp. 1, 236 and 217.
Motorola Technical Developments, vol. 7, Oct. 1987, Schaumburg, Ill., Ron Chapman et al Receive if Filter Compensation.
Patent Abstracts of Japan, vol. 15, No. 86 (E-1039) Feb. 28, 1991 & JP-A-23 01 315 (Sharp Corp) Dec. 13, 1990.
Patent Abstracts of Japan, vol. 14, No. 396 (E-970) Aug. 27, 1990 & JP-A-21 49 018 (Nec Eng Ltd) Jun. 7, 1990.
Patent Abstracts of Japan, vol. 14, No. 493 (E-995) Oct. 26, 1990 & JP-A-22 03 644 (Japan Radio Co. Ltd) Aug. 13, 1990.

Primary Examiner—Stephen Chin
Assistant Examiner—Don N. Vo
Attorney, Agent, or Firm—Frishauf, Holtz, Goodman & Woodward

[57] ABSTRACT

An automatic frequency control method for use in a receiver mixes a received signal and a local oscillator signal to produce an intermediate frequency signal and converts the intermediate frequency signal to a voltage signal. The voltage signal is converted to digital data which is then compared with a theoretical value, outputting frequency correction data which permits the difference between the digital data and the theoretical value to be minimized. The frequency of the local oscillator signal is controlled according to the frequency correction data so that the intermediate frequency signal becomes the normal frequency.

3 Claims, 8 Drawing Sheets

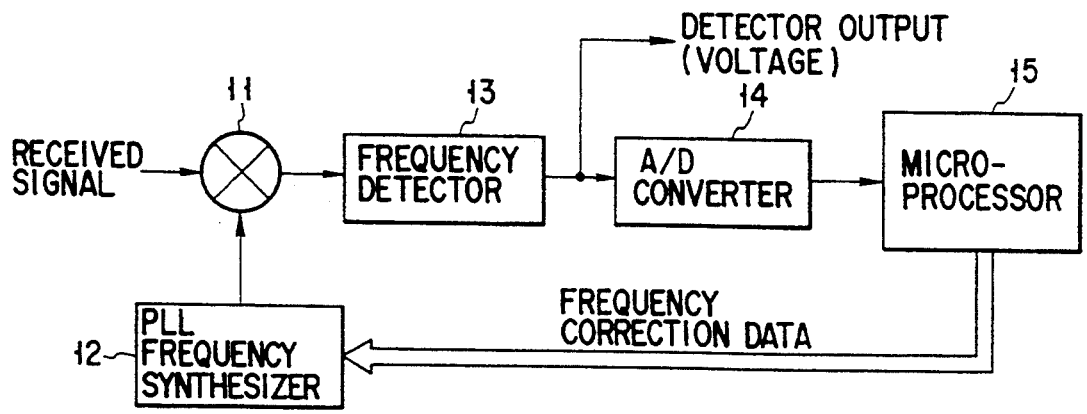
F I G. 2

AUTOMATIC FREQUENCY CONTROL METHOD AND DEVICE FOR USE IN RECEIVER

BACKGROUND OF THE INVENTION

1. Field of the Invention

The present invention relates to a method and device for automatic frequency control in receivers such as an FM receiver, GMSK (Gaussian Filtered Minimum Shift Keying) receiver, etc.

2. Description of the Related Art

Heretofore, such an automatic frequency control circuit as shown in FIG. 1 is known. In this circuit, a mixer 1 mixes a received signal and an output signal of a voltage-controlled local oscillator 2 to obtain an intermediate-frequency signal. The intermediate-frequency signal is converted by a frequency detector 3 to a voltage signal. The voltage signal is then output as a detector output signal. The detector output signal is also smoothed out by a time-constant circuit 4 to produce a DC voltage signal. The DC voltage signal is applied to the voltage-controlled local oscillator 2 to adjust its output frequency. That is, the conventional automatic frequency control circuit employs a feedback control system which feeds the DC voltage signal resulting from smoothing the detector output back to the voltage-controlled local oscillator 2 as an error voltage so that the difference between the received frequency and the local oscillator frequency, or the intermediate frequency may always match the center frequency of the frequency detector. (Refer to "NHK Radio FM technical textbook" Nippon Hoso Kyokai, Aug. 1, 1983, pp. 236 and 237.)

A problem with the conventional circuit is that the use of the time-constant circuit involves a time delay in smoothing the detector output and thus, when burst-like signals that are short in duration are received, the automatic frequency control circuit cannot respond to them, failing to achieve proper reception.

SUMMARY OF THE INVENTION

It is therefore an object of the present invention to provide a method and device for automatic frequency control which permits automatic frequency control to be achieved surely even when burst-like signals short in duration are received and accurate reception control to be achieved at all times.

According to an aspect of the present invention, there is provided a method of automatic frequency control for use in a receiver comprising the steps of:

mixing a received signal and a local oscillator signal to produce an intermediate frequency signal;

converting the intermediate frequency signal to a voltage signal;

converting the voltage signal to digital data;

outputting frequency correction data produced by comparing the digital data with a theoretical value; and controlling the frequency of the local oscillator signal with the frequency correction data so that the intermediate frequency signal may become the normal frequency.

According to another aspect of the present invention, there is provided a method of automatic frequency control for use in a receiver comprising the steps of:

mixing a received signal with a local oscillator signal to produce an intermediate frequency signal;

converting the intermediated frequency signal to a voltage signal;

converting the voltage signal to digital data;

identifying binary data of the received signal by performing arithmetic processing on the digital data;

outputting frequency correction data produced by performing a comparison operation on the digital data when the binary identification data is obtained and a theoretical value of digital data when an intermediate frequency obtained when a signal modulated with the same transmit data as the binary identification data is received becomes the normal frequency; and controlling the frequency of the local oscillator signal with the frequency correction data so that the intermediate frequency signal becomes the normal frequency.

According to still another aspect of the present invention, there is provided an automatic frequency control device for use in a receiver comprising:

mixing means for mixing a received signal with a local oscillator signal to produce an intermediate frequency signal;

frequency to voltage converting means for converting the frequency of the intermediate frequency signal from the mixing means to a voltage signal;

analog to digital converting means for converting the voltage signal from said frequency to voltage converting means to digital data;

arithmetic means for performing a comparison operation on the digital data from said analog to digital converting means and a theoretical value to output frequency correction data; and local oscillator means responsive to the frequency correction data for controlling the frequency of the local oscillator signal to be applied to said mixing means.

The automatic frequency control method and device of the present invention permits rapid detection and correction of frequency errors by using digital signal processing. Therefore, there is little delay involved in controlling the frequency of the local frequency signal. Automatic frequency control can be achieved surely even when a burst-like signal which is short in duration is received. Moreover, accurate frequency control can be achieved not only when a signal modulated with specific transmit data is received but also when a signal modulated with non-specific transmit data is received.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a schematic block diagram of an automatic frequency control circuit according to an embodiment of the present invention;

DETAILED DESCRIPTION OF THE PREFERRED EMBODIMENTS

Figure 1:
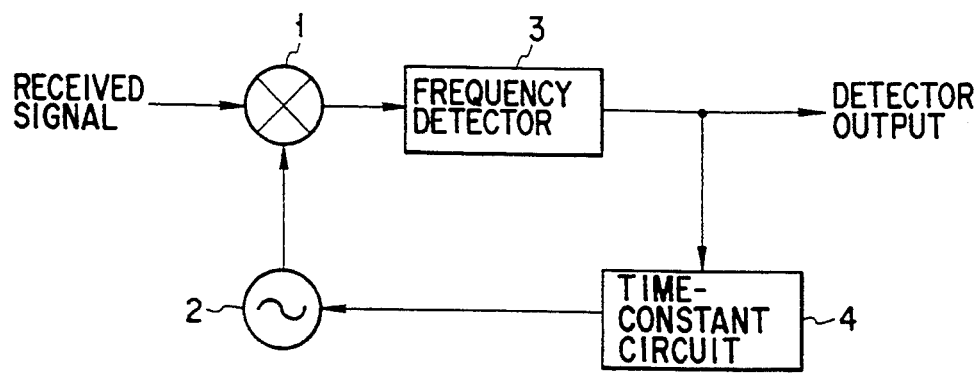
FIG. 1 illustrates one example of a conventional automatic frequency control circuit.

Hereinafter, an automatic frequency control method and device for use in a receiver will be described with reference to the accompanying drawings.

A received signal of a receiver is mixed with a local oscillator signal for conversion to an intermediate frequency signal and the resulting intermediate frequency signal is converted to a voltage signal. The voltage signal is converted to digital data which is, in turn, processed by an arithmetic processing circuit to obtain frequency correction data. The frequency correction data is used to correct frequency in such a way as to minimize an error resulting from comparison between digital data when the received signal is modulated with specific transmit data and a theoretical value when the received signal is modulated with the specific data and moreover the intermediate frequency signal matches the normal frequency. The local oscillator signal frequency is controlled by the frequency correction data, so that the intermediate frequency signal is corrected to the normal frequency.

Next, a device for implementing the automatic frequency control method described above will be described with reference to FIGS. 2 through 5.

As shown in FIG. 2, a received signal is mixed, in a mixer 11, with a local oscillator signal from a PLL (Phase Locked Loop) frequency synthesizer 12 serving as a local oscillator, so that the received signal is converted to the intermediate frequency signal. The intermediate frequency signal from the mixer 11 is applied to a frequency detector 13 which converts the frequency of an input signal to a voltage and sends out a voltage signal proportional to the input frequency as a detector output.

The detector output from the frequency detector 13 is converted by an A/D (analog/digital) converter 14 to 8-bit digital data which is, in turn, applied to a microprocessor 15. The microprocessor 15 constitutes an arithmetic means which performs a comparison operation on the digital data from the A/D converter 14 and a preset theoretical value to obtain frequency correction data. This frequency correction data is applied to the PLL frequency synthesizer 12.

In the case where, for example, successive 1s, a specific receive signal, are input, supposing the frequency deviation to be 8 KHz, then the receive signal and the intermediate frequency signal will have a sideband of a frequency which is 8 kHz higher than the carrier frequency. This sideband allows the frequency detector 13 to output a voltage VHR of, for example, 3 volts. When successive 0s are input as a specific received signal, on the other hand, the received signal and the intermediate frequency signal will have a sideband of a frequency which is 8 KHz lower than the carrier frequency. This sideband allows the frequency detector to output a voltage VLR of, for example, 0 volts.

Figure 3:
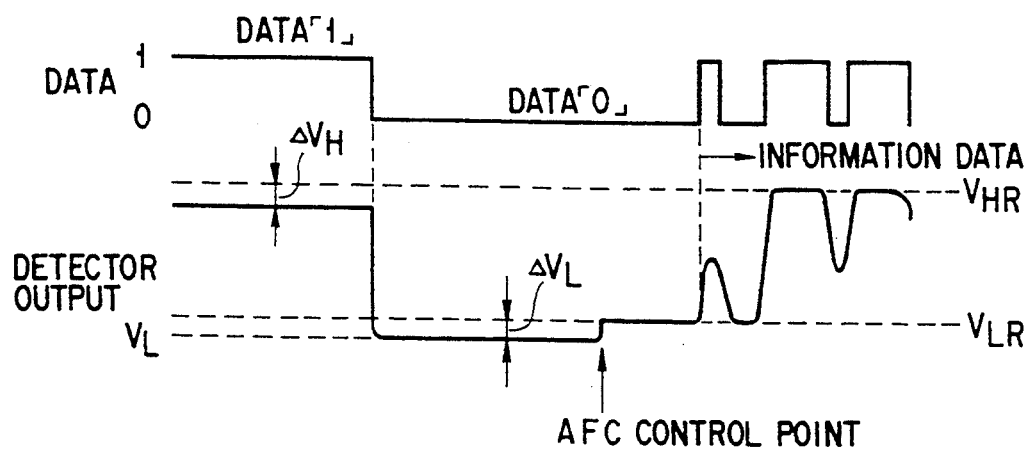
FIG. 3 is a waveform diagram illustrating a received signal waveform and a detector output waveform in the embodiment of FIG. 2 for comparison therebetween.

The output voltage of the frequency detector actually contains an error $\Delta VH$ for data 1s and an error $\Delta VL$ for data 0s as shown in FIG. 3. The error is due to a frequency error of the intermediate frequency signal resulting from a difference in frequency between transmission and reception. The error has a value of the order of 2 to 4 ppm (2.4 to 5 KHz in the 1.2 GHz band). Note that data of successive 1s and data of successive 0s are transmitted prior to information data.

The microprocessor 15 performs a comparison operation on digital data from the A/D converter 14 and preset values (8-bit digital values of VHR=3 V and VLR=0 V) to obtain errors $\Delta VH$ and $\Delta VL$ and calculates an amount of correction of the local oscillator frequency in order to minimize the errors, i.e., the intermediate frequency error. The result of the calculation is applied to the PLL frequency synthesizer 12 as frequency correction data.

That is, the automatic frequency control is achieved by comparing digital data output from the A/D converter 14 when a received signal is modulated with specific transmit data of 1s and 0s with theoretical values when a received signal is modulated with the specific transmit data and moreover the intermediate frequency is identical to the normal frequency, obtaining frequency correction data which permits the differences to be minimized and controlling the PLL frequency synthesizer 12 with the frequency correction data so that the resulting intermediate frequency signal will match the normal frequency.

As shown in FIG. 3, when a signal modulated with specific data 0s is received, there is obtained the difference $\Delta VL$ between the detector output voltage VL corresponding to the received signal and the detector output voltage VLR obtained when the intermediate frequency signal is identical to the center frequency of the frequency detector 13. The microprocessor 15 calculates such frequency correction data as permits $\Delta VL$ to be minimized. The frequency correction data is applied to the PLL frequency synthesizer to thereby achieve the automatic frequency control (AFC).

In the present embodiment, suppose that the frequency of the PLL frequency synthesizer 12 is corrected by 1 KHz for the minimum unit of the frequency correction data. In the frequency detector 13, an output of $2V \pm 1V$, i.e., in the range 1 to 3 volts, is obtained for the maximum frequency deviation of a received signal, $\pm 8$ KHz. Thus, the control system has a correction sensitivity K of 16 KHz/2=8 KHz/V.

The amplitude of a detector output signal is in the range $+1$ volts centered around the voltage corresponding to the center frequency, and the A/D converter 14 has a dynamic range $\pm 1.75$ volts. Thus, in order to keep the detector output from saturation, it is required that the center voltage be in the range $\pm 0.75$ volts. This range of the center voltage will permit the frequency correction to be achieved correctly. Hence, in the present embodiment, the frequency correction is achieved within the range $\pm 0.75 \times K = \pm 6$ KHz.

The microprocessor 15 calculates the average of $\Delta VH$ and $\Delta VL$, $\Delta V = (\Delta VH + \Delta VL)/2$, and subsequently obtains the amount of frequency correction $\Delta f = \Delta V \times K$. Since the minimum unit in which the frequency correction is made is 1 KHz, if $\Delta f$ is calculated to be, for example, 3.3 KHz, the nearest integer, i.e., 3 KHz is taken as the amount of frequency correction $\Delta f'$.

Next, the microprocessor 15 adds the frequency correction amount $\Delta f'$ and the current frequency setting data and applies the resulting frequency correction data to the PLL frequency synthesizer 12.

Figure 4:
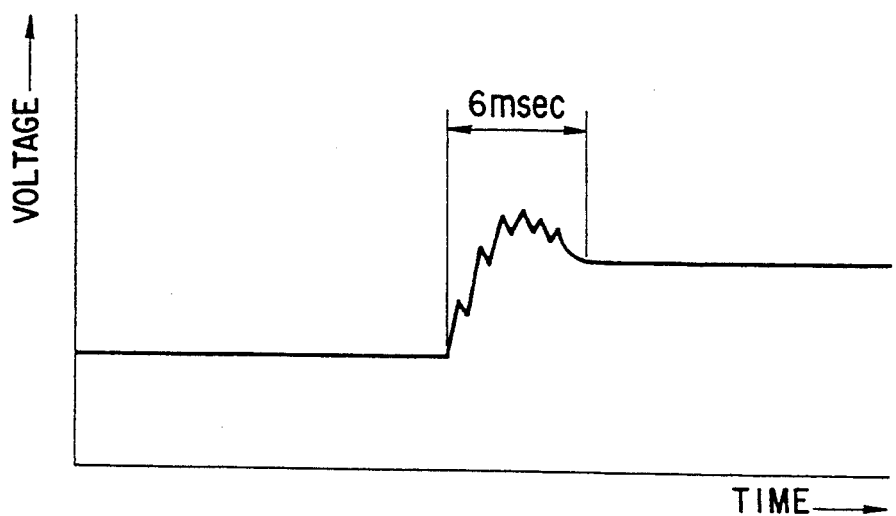
FIG. 4 is a waveform diagram of the PLL control voltage at the time of automatic frequency control in the embodiment of FIG. 2.

The local oscillator signal frequency is corrected in the PLL frequency synthesizer 12 in that way and consequently the intermediate frequency is corrected to most approach the center frequency of the frequency detector 13, thus permitting accurate reception and detection to be performed. The time it takes for the corrected frequency to become stable is about 6 milliseconds as shown in FIG. 4, which is adequate in practical application.

Next, consider the timing of performing the frequency control operation that the microprocessor 15 outputs frequency correction data to thereby cause the PLL frequency synthesizer 12 to make correction of the local oscillator frequency. If the frequency control is made during an interval when specific data of successive 0s (this is a type of dummy data, not information data) is being received as shown as an AFC control point in FIG. 3 or during an interval when specific data of successive 1s (this is a type of dummy data, not information data) is being received in the case where frequency correction is made using an error $\Delta VH$ obtained from only successive 1s, the dropout of information data will never arise from the frequency correction.

Figure 5:
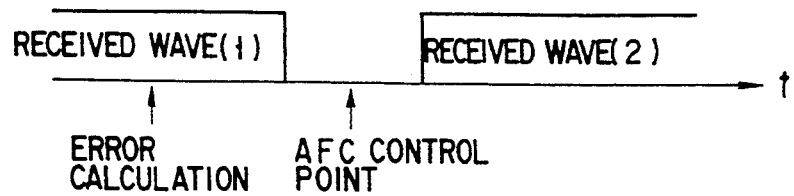
FIG. 5 is a diagram for use in explanation of the timing of frequency correction.

Suppose a case where an incoming signal arrives in burst form as shown in FIG. 5. If the frequency control is made during a time interval between a received wave (1) and a received wave (2), then the dropout of information data will never occur in this case as well.

Figure 6:
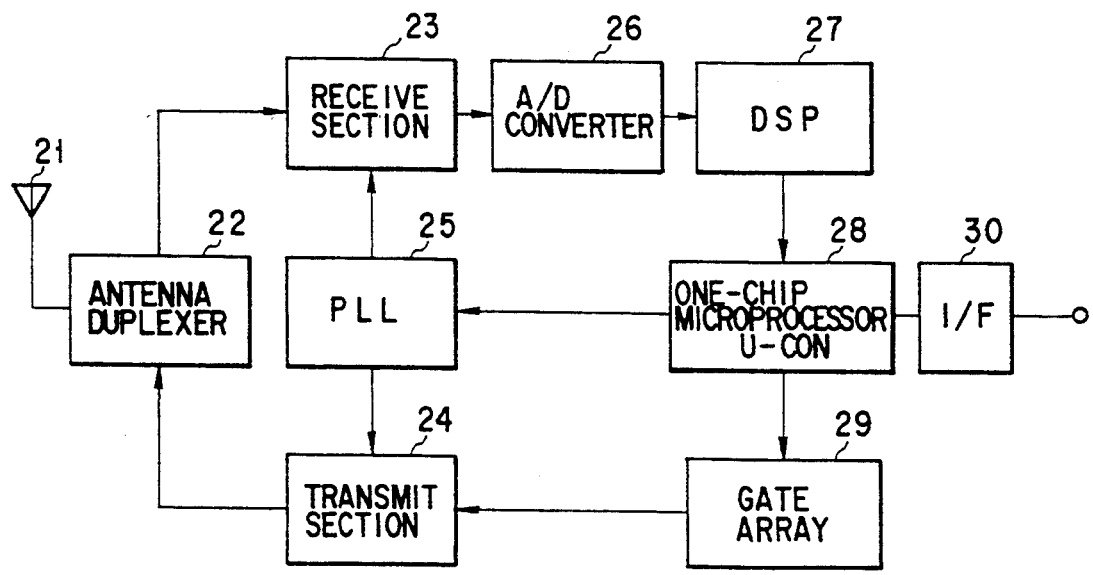
FIG. 6 is a block diagram of an in-plant wireless equipment into which the automatic frequency control device of the present invention is incorporated.

FIG. 6 illustrates an application of the present invention to an in-plant wireless unit conforming to the 2-GHz band data transmission wireless installation (small power wireless) specifications. The in-plant wireless unit is constructed from an antenna 21, an antenna duplexer 22, a receive section 23, a transmit section 24, a PLL frequency synthesizer 25, an A/D converter 26, a DSP (Digital Signal Processor) 27, a one-chip microcomputer 28, a gate array 29 and an interface (I/F) 30.

In the in-plant wireless unit, an incoming signal received by the antenna 21 is applied to the receive section 23 via the antenna duplexer 22. The receive section 23 has a mixer and a frequency detector. In the mixer the received signal is mixed with a local oscillator signal from the PLL frequency synthesizer 25 for conversion to an intermediate frequency signal. The resulting intermediate frequency signal is applied to the frequency detector which provides a voltage signal corresponding to the input signal frequency.

The voltage signal from the receive section 23 is converted by the A/D converter 26 to digital data which is, in turn, applied to the DSP 27. The DSP 27, together with the one-chip microcomputer 15, constitutes the same circuit as the microprocessor 15 in the previous embodiment and calculates the amount of frequency correction corresponding to the voltage error on the basis of digital data from the A/D converter 26, which is applied to the one-chip microcomputer 28. Note that the DSP 27 is arranged to achieve logical decision of detector outputs, clock regeneration, establishment of synchronization, etc., as well as automatic frequency control (AFC).

The one-chip microcomputer 28 supplies the PLL frequency synthesizer 25 with the amount of frequency correction fed from the DSP 27 as frequency correction data.

At the time of transmission, the one-chip microcomputer 28 controls the gate array 29 and the PLL frequency synthesizer 25, so that a transmit signal is fed from the transmit section 24 to the antenna 21 via the antenna duplexer 22 and then radiated from the antenna 21 to outside. Note that data transmission is allowed between the microcomputer 28 and external equipment, such as a personal computer, via the interface 30.

Thus, the application of the present invention to an in-plant wireless unit permits accurate reception control to be achieved at all times, thereby providing an in-plant wireless unit of great practical utility.

The above-described embodiment concerns the case where an incoming signal is modulated with specific transmit data of 1s and 0s. Next, another embodiment of the present invention will be described which permits accurate frequency control to be achieved even when a signal modulated with non-specific data is received.

Figure 7:
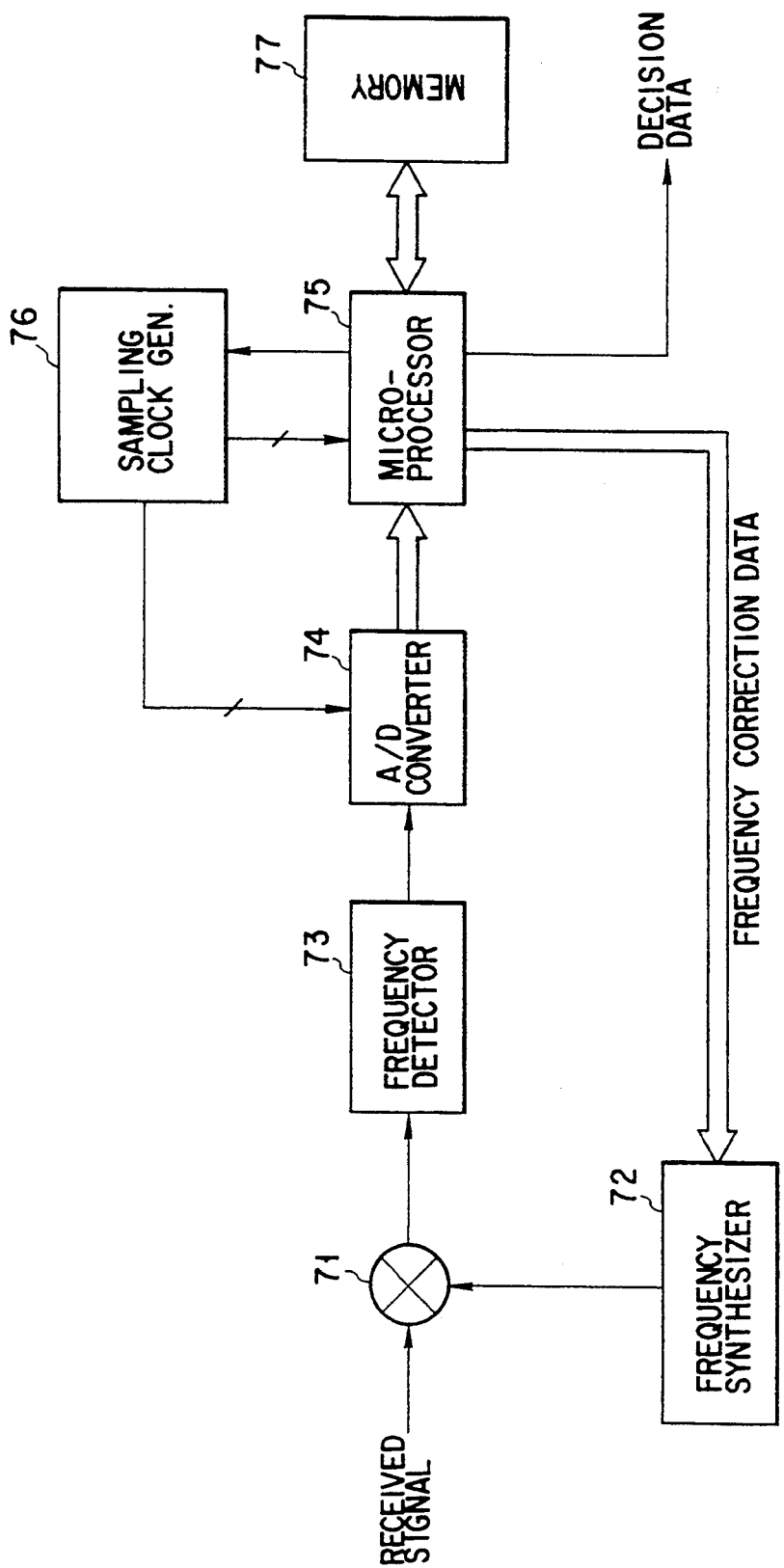
FIG. 7 is a block diagram of an automatic frequency control device according to the other embodiment of the present invention.

FIG. 7 is a block diagram of an automatic frequency control device according to the other embodiment of the present invention. An incoming signal is mixed, in a mixer 71, with a local oscillator signal from a PLL frequency synthesizer 72 for conversion to an intermediate frequency signal. The intermediate frequency signal is then applied to a frequency detector 73. The frequency detector 73 performs input signal frequency to voltage conversion and outputs a voltage signal whose amplitude is proportional to the input frequency as a detector output.

The detector output of the frequency detector 73 is converted by an A/D converter 74 to a digital information value which is, in turn, applied to a microprocessor 75. The microprocessor 75 controls a sampling clock generator 76, which generates and supplies sampling clock pulses to the A/D converter 74 and the microprocessor 75. The sampling clock pulses are used to control the timing of data entry into the A/D converter 74 and the microprocessor 75.

The microprocessor 75 constitutes an arithmetic means which performs arithmetic processing on a digital information value from the A/D converter 74 using a memory 77 and receives an input signal to make a nonspecific data decision as to whether or not to perform frequency correction. The microprocessor 75 performs a comparison operation on the digital information value from the A/D converter 74 and a theoretical value preset in the memory 77 to obtain frequency correction data. The frequency correction data is applied to the PLL frequency synthesizer 72.

Before proceeding with a description of automatic frequency control for a received signal modulated with non-specific data by the device shown in FIG. 7, it is noted that the device also has the ability to achieve automatic frequency control for a received signal modulated with specific data of 1s and 0s as will be described below.

Suppose that the frequency deviation is 8 KHz when specific data of successive 1s is received. Then, the received signal and the intermediate frequency signal have a sideband which is 8 KHz higher than the carrier frequency. This sideband permits the frequency detector 73 to produce a voltage of VHR. In the case of successive 0s, the received signal and the intermediate frequency signal have a sideband which is 8 KHz lower than the carrier frequency. This sideband permits the frequency detector 73 to produce a voltage of VLR.

Figure 8:
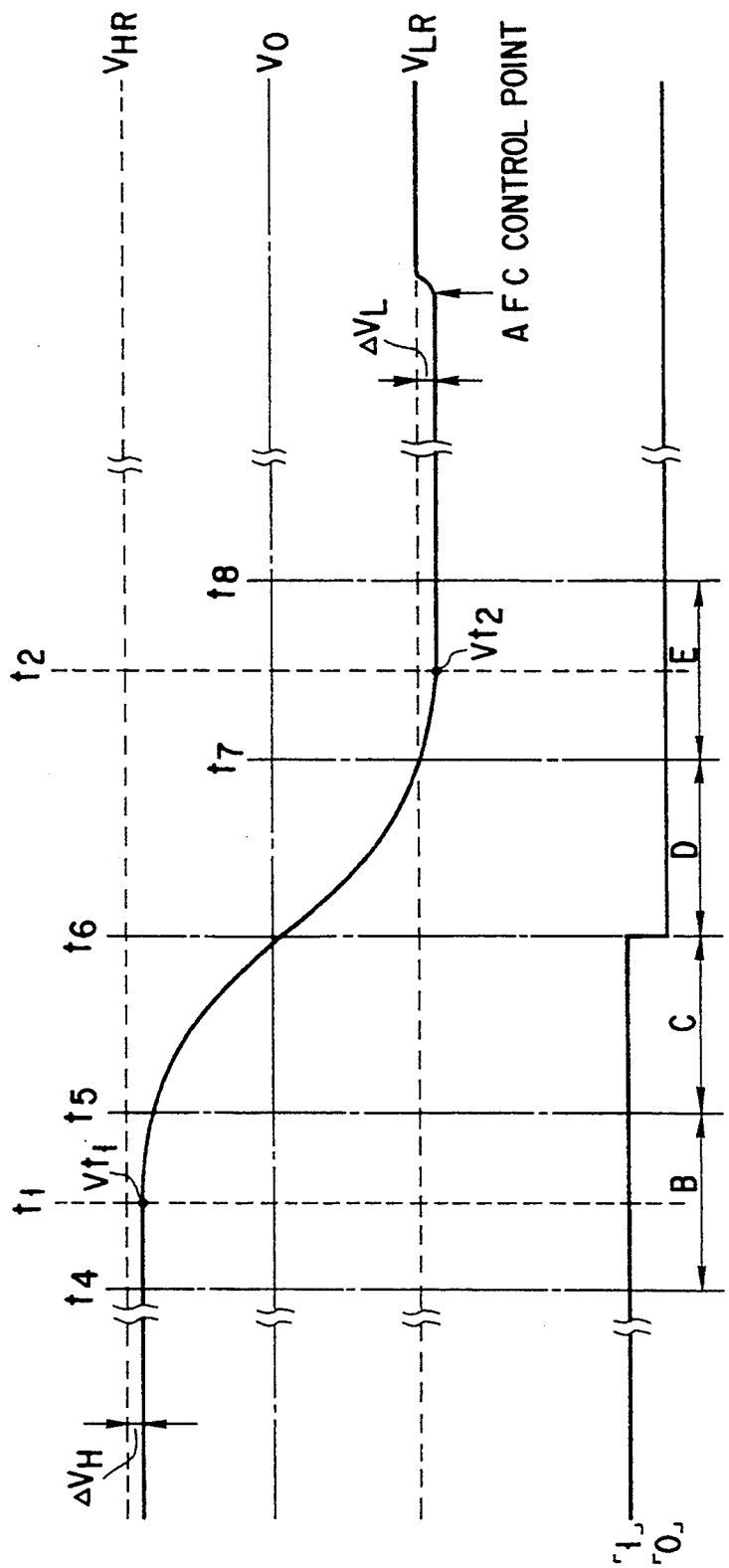
FIG. 8 is a diagram illustrating a frequency detector output waveform and a specific data waveform for use in explanation of the operation of the equipment of FIG. 7.

Actually, these output voltages involve an error of $\Delta$VH for data 1s and an error of $\Delta$VL for data 0s as shown in FIG. 8 because of an intermediate frequency error.

When a detector output signal shown in FIG. 8 is obtained, the digital information values output from the A/D converter 74 are fed into the microprocessor 75 at times t1 and t2 corresponding to the centers of two contiguous bits B and E of the output data, excluding bits one bit before and after the point at which data changes from 1 to 0, i.e., bits C and D. Thus, Vt1 is obtained at the time t1 before the time t6 at which data changes. The output values of the A/D converter 74 are all Vt1 before the time t1.

The microprocessor 75 makes a comparison between the output value Vt1 of the A/D converter 74 and the preset high-level theoretical value (VHR) to obtain an error or difference $\Delta$VH. After the point t6 as well, the microprocessor 75 likewise makes a comparison between the output value Vt2 of the A/D Converter 74 and the preset low-level theoretical value (VLR) to obtain an error $\Delta$VL.

In order to minimize the error voltage thus obtained, that is, the intermediate frequency error, the microprocessor calculates a required amount of correction of the local oscillator frequency and applies the result of the calculation to the PLL frequency synthesizer 72.

In the present embodiment, suppose that the frequency correction of the PLL frequency synthesizer 72 is made by 1 KHz for the minimum unit of the frequency correction data. In the frequency detector 73, the outputs of VLR and VHR are obtained for the maximum frequency deviation of a received signal, ±8 KHz.

The microprocessor 75 calculates the average of $\Delta$VH and $\Delta$VL, $\Delta$V=($\Delta$VH+$\Delta$VL)/2, and subsequently obtains an amount of frequency correction $\Delta$f=$\Delta$V×K. Since the minimum unit in which the frequency correction is made is 1 KHz, if $\Delta$f is calculated to be, for example, 3.3 KHz, the nearest integer, i.e., 3 KHz is taken as the amount of frequency correction $\Delta$f'.

The microprocessor 75 adds the frequency correction amount $\Delta$f' and the current frequency setting data and applies the resulting frequency correcting data to the PLL frequency synthesizer 72.

The local oscillator frequency is corrected in that way in the PLL frequency synthesizer 72 and consequently the intermediate frequency is corrected to most approach the center frequency of the frequency detector 73, thus permitting accurate reception and detection to be performed.

In the case where the transmitter sends such specific data as shown in FIG. 8 prior to transmission of information data, consider the timing of the outputting of the frequency correction data from the microprocessor 75 to thereby cause the PLL frequency synthesizer to make correction of the local oscillator frequency. If the frequency control is made at a time when specific data of successive 0s is received as shown as an AFC control point in FIG. 8, the dropout of information data will never arise from the frequency correction. In the case where frequency correction is made using the error $\Delta$VH obtained from only successive 1s, on the other hand, if the frequency correction is made at a time when specific data of successive 1s is received, the dropout of information data will never arise from the frequency correction.

Next, the operation when non-specific data is received will be described.

Figure 9:
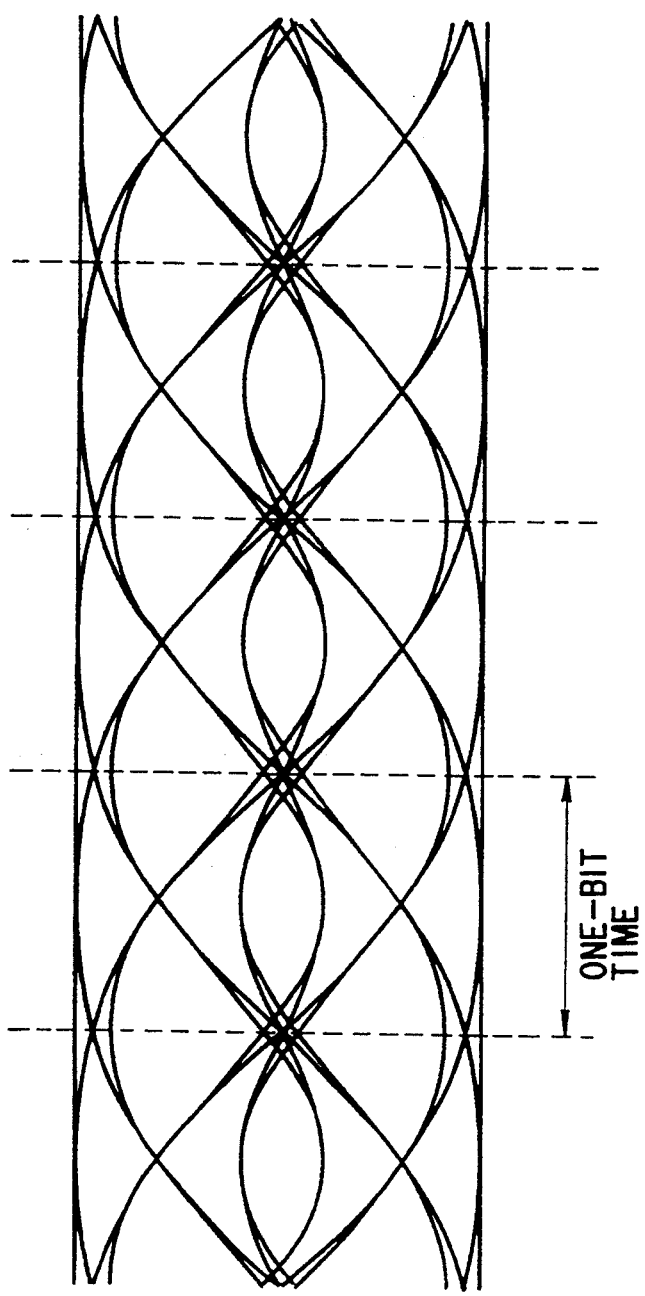
FIG. 9 is a diagram illustrating eye patterns of frequency detector output signals of GMSK modulated waves.

As can be seen from the eye patterns of frequency detector output signals for GMSK modulated waves (B.b T=0.25) in FIG. 9, when three or more bits of the same data last, the amplitude of a frequency detector output signal becomes maximum. Therefore, when three or more bits of the same data last, if the frequency detector output signal is sampled at a time corresponding to each center of the neighboring bits of non-specific data with each one bit before and after the point at which the polarity of amplitude of non-specific data changes, the sample voltage will become maximum or minimum.

Figure 10:
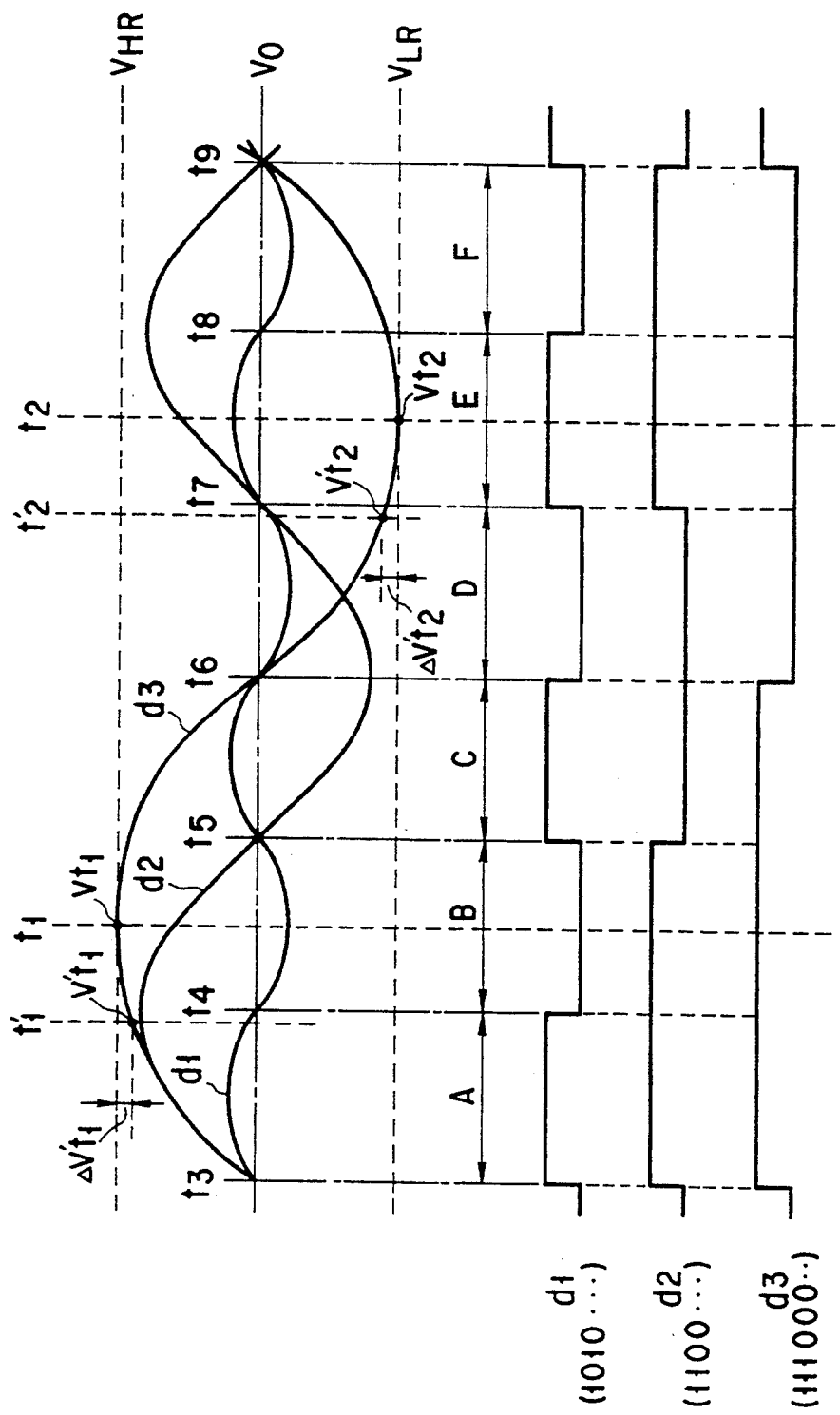
FIG. 10 is a waveform diagram for use in explanation of a timing relationship between decision data waveforms and frequency detector output waveforms and wrong decision.

Suppose that such frequency detector output signals as shown in FIG. 10 are obtained from the frequency detector 73. In the cases of data d1 (in which a 1 and a 0 alternate, i.e., 101010 . . . ) and data d2 (in which two successive 1s and two successive 0s alternate, i.e., 1001100 . . . ), the microprocessor 75 does not change the frequency correction data because they have no three or more successive 1s or 0s.

In the case of data d3 (three successive 1s and three successive 0s alternate, i.e., 111000111000 . . . ), the microprocessor 25 samples the frequency detector output signal at times t1 and t2 corresponding to the centers of the neighboring bits with each one bit before and after the points t3, t6, t9 at which data changes, i.e., the bits B and E, thereby obtaining Vt1 and Vt2.

The microprocessor 75 compares Vt1 and Vt2 with the preset theoretical values VHR and VLR, respectively, thereby obtaining errors $\Delta$VH and $\Delta$VL. In the case of FIG. 10, $\Delta$VH=$\Delta$VL. The microprocessor 75 then calculates an amount of correction of the local oscillator frequency required to minimize the error voltage thus obtained, i.e., the intermediate frequency error. The result of the calculation is applied to the PLL frequency synthesizer 72 as frequency correction data.

In order to perform such operation, it is required to make a frequency detector output signal decision as to whether or not to perform frequency correction. As the method of the above mentioned data decision may be used in which, when a frequency detector output signal voltage is greater than the center level of the frequency detector 73 at the time of sampling, data is identified as a 1, otherwise data is identified as a 0. Alternatively, the conventionally known ½-bit offset data decision method may be used. Namely, use may be made of any data decision method if it can be implemented by software of the microprocessor 75. Whatever the data decision method may be used, however, when data d3 is received, it is not until the time t1 is past that the bit C is identified as a 1 and three bits A, B and C are identified as successive 1s. In the present embodiment, therefore, a frequency detector output signal voltage at the identification timing of one-bit before the timing of identification of the latest bit C and a total of three identification bits comprising the latest identification bit C and two identification bits A and B before the latest one are always stored in the memory 77.

In this way, automatic frequency control is achieved even when non-specific data is received.

In order to further ensure the automatic frequency control when the non-specific data is received, the following control operation is added.

That is, if the decision data is 1, the microprocessor 75 makes a comparison between an output value of the A/D converter 74 and the preset high-level theoretical value VHR to obtain the error ΔVH and then controls the local oscillator frequency of the PLL frequency synthesizer 72 according to the error voltage only when the frequency detector output signal voltage at the time of sampling is greater than the preset high-level theoretical value VHR. On the other hand, if the decision data is a 0, the microprocessor 75 makes a comparison between an output value of the A/D converter 74 and the preset low-level theoretical value VLR to obtain the error ΔVL and then controls the local oscillator frequency of the PLL frequency synthesizer 72 according to the error voltage only when the frequency detector output signal voltage at the time of sampling is less than the preset low-level theoretical value VLR.

In case where the above control operation is not performed, if the sampling clock generator 76 is out of sync so that the sampling timing varies from the correct time t1 to the wrong time t1' as shown in FIG. 10, the frequency detector output signal voltage will become Vt1' and the microprocessor 75 will calculate an error voltage ΔVt1'. This means that the microprocessor 75 will make a wrong decision that the frequency detector output signal has been varied by ΔVt1 because of a drift of the local oscillator signal frequency. In case where the sampling timing varies, the microprocessor 75 will change the frequency correction data for the PLL frequency synthesizer 72 and perform wrong frequency control in spite of the fact that there is no variation of the local oscillator signal frequency as shown in FIG. 10.

Figure 11:
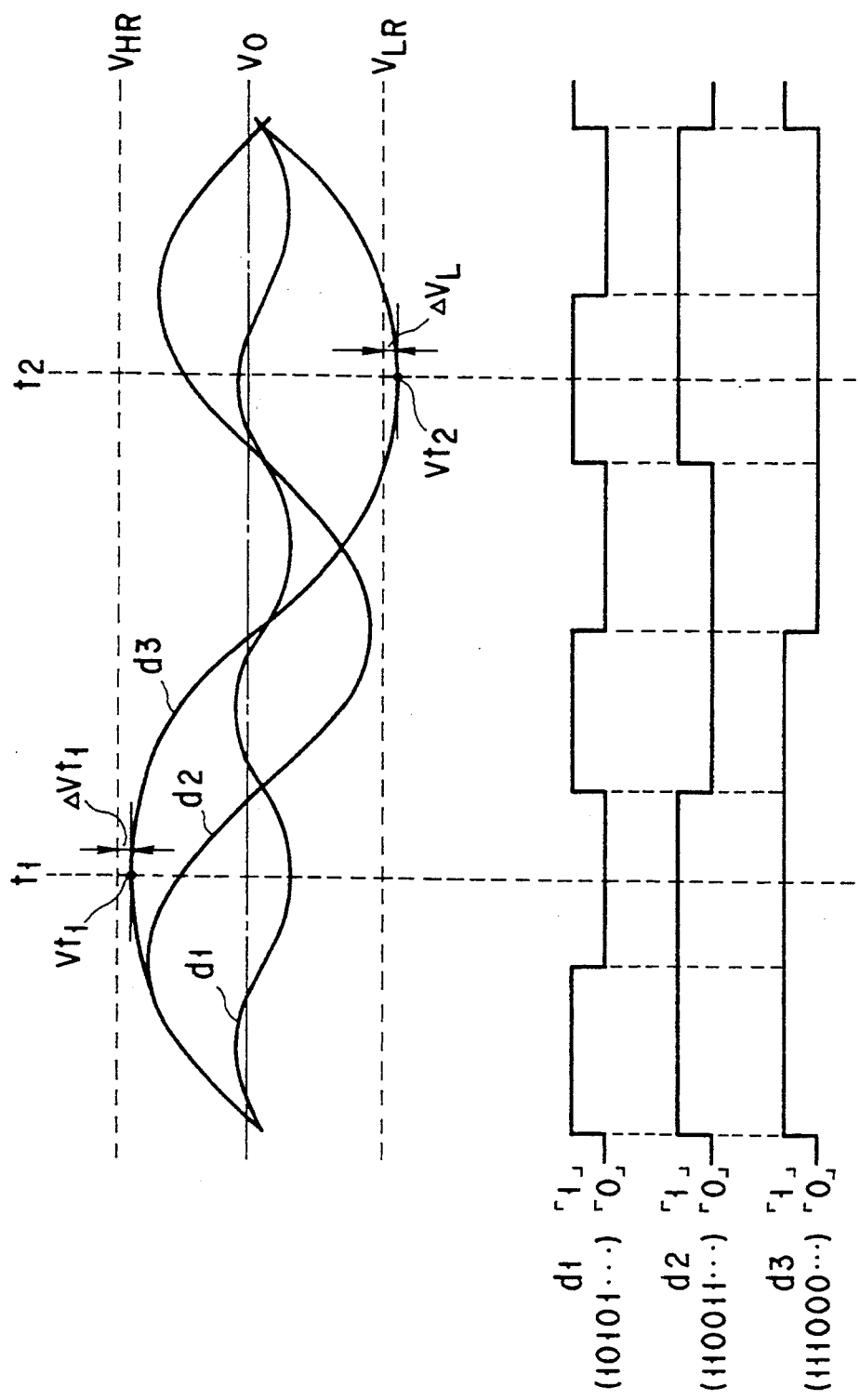
FIG. 11 is a waveform diagram for use in explanation of a timing relationship between decision data waveforms and frequency detector output waveforms and normal decision.

In the above-described control when the decision data is 1 is applied, on the other hand, since the signal voltage Vt1' at the time t1' is less than the theoretical value VHR, the frequency of the PLL frequency synthesizer 72 will not be varied. That is, the above control method has an advantage that no wrong operation is performed even if the sampling clocks are out of sync. In case a drift really occurs in the local oscillator frequency, since Vt2<VLR at the time t2 as shown in FIG. 11, the error ΔVL is detected correctly and accurate frequency control is achieved.

As described above, accurate frequency control can be achieved not only when specific data is received but also when non-specific data such as information data is received.

In the above-described embodiment, when the same decision data lasts for three or more bit times, the bit signal at the timing corresponding to the center of the neighboring bit of the decision data with each one bit before and after the point at which the decision data changes is compared with the theoretical values VHR and VLR. The present invention is not necessarily limited to this control. This control may be modified to, when the same decision data lasts for three or more bit times, sample a bit signal at each time corresponding to the center of the neighboring bit of the decision data with each one bit before and after the point at which the decision data changes, obtain the average of sample values obtained by performing the sampling a predetermined number of times and including the latest sample value and comparing the average with the theoretical values VHR and VLR. This makes signal voltages to be compared with the theoretical values accurate even if there is some variation in signal voltages Vt1, Vt2. Thus, the frequency control based on errors ΔVH, ΔVL can be achieved accurately.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of automatic frequency control for use in a receiver comprising the steps of:

mixing a received signal with a local oscillator signal to produce an intermediate frequency signal, the received signal including GMSK modulated waves;

converting the intermediate frequency signal to a voltage signal;

converting the voltage signal to digital data;

identifying binary data of the received signal by performing arithmetic processing on the digital data;

outputting frequency correction data produced by the step of comparing the digital data with a theoretical value of digital data when the binary identification data is obtained, and when an intermediate frequency which is obtained when a signal modulated with the same transmit data as the binary identification data is received, becomes a normal frequency, and the step of outputting frequency correction data comprising the steps of:

comparing a digital information value at a timing corresponding to a center of a neighboring bit of the binary identification data with each one bit before and after a point at which the binary identification data changes with a digital theoretical value at a timing corresponding to a center of a second bit:

only when at lest three successive bits of the binary identification data are identical to one another, and when an intermediate frequency, obtained when three bits of the signal modulated with transmit data which is the same as the binary identification data whose at least three successive bits are identical is received successively, becomes the normal frequency, and outputting frequency correction data which permits a difference of said comparing step to be minimized; and controlling the frequency of the local oscillator signal with the frequency correction data so that the intermediate frequency signal becomes the normal frequency.

2. A method of automatic frequency control for use in a receiver comprising the steps of:

mixing a received signal with a local oscillator signal to produce an intermediate frequency signal, the received signal including GMSK modulated waves;

converting the intermediate frequency signal to a voltage signal;

converting the voltage signal to digital data;

identifying binary data of the received signal by performing arithmetic processing on the digital data;

outputting frequency correction data produced by the step of comparing the digital data with a theoretical value of digital data when the binary identification data is obtained, and when an intermediate frequency which is obtained when a signal modulated with the same transmit data as the binary identification data is received, becomes a normal frequency, and the step of outputting frequency correction data comprises the steps of:

sampling a digital information value at a time corresponding to a center of a neighboring bit of the binary identification data with each one bit before and after a point at which the binary identification data changes, only when at least three successive bits of the binary identification data are identical to one another, obtaining an average of sample values obtained by performing the sampling a predetermined number of times and including a latest sample value, comparing the average with a digital theoretical value at a timing corresponding to a center of a second bit when an intermediate frequency, obtained when three bits of the signal modulated with transmit data which is the same as the binary identification data whose at least three successive bits are identical is received successively, becomes the normal frequency, and outputting frequency correction data which permits a difference of said comparing step to be minimized; and controlling the frequency of the local oscillator signal with the frequency correction data so that the intermediate frequency signal becomes the normal frequency.

3. A method of automatic frequency control for use in a receiver comprising the steps of:

mixing a received signal with a local oscillator signal to produce an intermediate frequency signal;

converting the intermediate frequency signal to a voltage signal;

converting the voltage signal to digital data;

identifying binary data of the received signal by performing arithmetic processing on the digital data;

outputting frequency correction data produced by the step of comparing the digital data with a theoretical value of digital data when the binary identification data is obtained, and when an intermediate frequency which is obtained when a signal modulated with the same transmit data as the binary identification data is received, becomes a normal frequency, the step of outputting frequency correction data comprising the steps of:

outputting frequency correction data which permits a difference of said comparing step to be minimized, in one of the following two situations:

(a) when binary identification data is 1, and only when the voltage signal level is greater than a high-level said theoretical value which is preset on the basis of a frequency deviation of the received signal, and (b) when binary identification data is 0, and only when the voltage signal level is smaller than a low-level said theoretical value which is preset on the basis of a frequency deviation of the received signal; and controlling the frequency of the local oscillator signal with the frequency correction data so that the intermediate frequency signal becomes the normal frequency.

* * * * *